United States Patent
Kakinuma

(10) Patent No.: US 12,211,732 B2
(45) Date of Patent: Jan. 28, 2025

(54) METHOD OF TRANSFERRING WAFER

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 188 days.

(21) Appl. No.: 17/822,011

(22) Filed: Aug. 24, 2022

(65) Prior Publication Data

US 2023/0073080 A1 Mar. 9, 2023

(30) Foreign Application Priority Data

Sep. 7, 2021 (JP) ................. 2021-145594

(51) Int. Cl.
*H01L 21/683* (2006.01)
*H01L 21/67* (2006.01)
*H01L 21/78* (2006.01)

(52) U.S. Cl.
CPC .... *H01L 21/6836* (2013.01); *H01L 21/67092* (2013.01); *H01L 21/78* (2013.01)

(58) Field of Classification Search
CPC .................................................. H01L 21/6836
See application file for complete search history.

(56) References Cited

U.S. PATENT DOCUMENTS

| | | | | |
|---|---|---|---|---|
| 2008/0286948 A1* | 11/2008 | Miyazaki | ............... | H01L 21/78 438/464 |
| 2015/0332928 A1* | 11/2015 | Priewasser | ............ | H01L 23/544 438/460 |
| 2018/0261579 A1* | 9/2018 | Huska | ............... | H01L 21/67715 |

FOREIGN PATENT DOCUMENTS

| | | | | |
|---|---|---|---|---|
| JP | 2002192370 A | | 7/2002 | |
| JP | 2017162870 A | | 9/2017 | |
| JP | 2018137415 A | * | 8/2018 | ........... H01L 21/187 |
| KR | 10-1351615 B1 | * | 1/2014 | ........... B32B 37/156 |
| KR | 10-2017-0097557 A | * | 8/2017 | ........... H01L 21/268 |

OTHER PUBLICATIONS

Machine translation KR101351615B1 (Year: 2014).*
Machine translation JP2018137415A (Year: 2018).*
Machine translation JP2002192370A (Year: 2002).*
Machine translation KR20170097557A (Year: 2017).*
Machine translation JP2017162870A (Year: 2017).*

* cited by examiner

*Primary Examiner* — Jacob T Minskey
*Assistant Examiner* — Wayne K. Swier
(74) *Attorney, Agent, or Firm* — Greer, Burns & Crain, Ltd.

(57) ABSTRACT

Disclosed herein is a method of transferring a wafer from a first tape that has been pressure-bonded to one surface of the wafer and also to a first frame having an opening with the wafer positioned therein, to a second tape that has been pressure-bonded to a second frame. The method includes a first-frame removing step of detaching the first tape from the first frame by pressing a portion of the first tape that lies between the first frame and the wafer, a second-frame pressure-bonding step of pressure-bonding the second tape pressure-bonded to the second frame to another surface of the wafer, a pressure-bonding force reducing step of reducing a pressure-bonding force of the first tape by imparting an external stimulus to the first tape, and a peeling step of peeling off the first tape from the one surface of the wafer pressure-bonded to the second tape.

19 Claims, 6 Drawing Sheets

METHOD OF TRANSFERRING WAFER

BACKGROUND OF THE INVENTION

Field of the Invention

The present invention relates to a method of transferring a wafer from a first tape that has been pressure-bonded to one surface of the wafer and also to a first frame, to a second tape that has been pressure-bonded to a second frame.

Description of the Related Art

Wafers having a plurality of devices, such as integrated circuits (ICs) or large-scale integration (LSI) circuits, formed in respective areas demarcated on their face sides by a plurality of intersecting projected dicing lines are divided into individual device chips by a dicing apparatus. The device chips will be used in electronic devices such as personal computers.

According to another proposed technology, a tape is affixed to a face side of a wafer and held on a chuck table, and a laser beam having a wavelength transmittable through the wafer is applied to a reverse side of the wafer while a focused spot of the laser beam is being positioned within the wafer along projected dicing lines thereof, thereby forming modified layers in the wafer along the projected dicing lines. Then, external forces are exerted on the wafer to divide the wafer into individual device chips along the modified layers that function as division initiating points (see, for example, Japanese Patent No. 3408805).

For picking up the device chips from the tape, it is necessary to affix another tape to the reverse side of the wafer and bring the face side of the wafer into an exposed state. To meet the above need, there has been proposed a technology for transferring the wafer affixed the tape to the other tape in order to expose the face side of the wafer (see, for example, Japanese Patent No. 6695173).

SUMMARY OF THE INVENTION

When the technology disclosed in Japanese Patent No. 6695173 mentioned above is carried out, the tape affixed to the wafer has to be cut along an outer circumferential edge of the wafer. However, the wafer occasionally tends to be damaged when the tape is thus cut.

It is therefore an object of the present invention to provide a method of transferring a wafer from a tape to another tape without the wafer being damaged.

In accordance with an aspect of the present invention, there is provided a method of transferring a wafer from a first tape that has been pressure-bonded to one surface of the wafer and also to a first frame having an opening with the wafer positioned therein, to a second tape that has been pressure-bonded to a second frame, including a first-frame removing step of detaching the first tape from the first frame by pressing a portion of the first tape that lies between the first frame and the wafer, a second-frame pressure-bonding step of pressure-bonding the second tape pressure-bonded to the second frame to another surface of the wafer, a pressure-bonding force reducing step of reducing a pressure-bonding force of the first tape by imparting an external stimulus to the first tape, and a peeling step of peeling off the first tape from the one surface of the wafer pressure-bonded to the second tape.

Preferably, the pressure-bonding force reducing step is carried out before the first-frame removing step. Preferably, the first tape is an ultraviolet-curable tape that is cured upon exposure to ultraviolet rays, and the pressure-bonding force reducing step includes the step of applying ultraviolet rays to the first tape to reduce the pressure-bonding force thereof.

The method of transferring a wafer according to the present invention makes it possible to transfer a wafer from a first tape to a second tape without causing damage to the wafer.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

A method of transferring a wafer according to an embodiment of the present invention will be described hereinbelow with reference to the accompanying drawings. The method of transferring a wafer according to the present embodiment to be described below is performed after a tape has been affixed to a face side of a wafer and held on a chuck table and then a laser beam having a wavelength transmittable through the wafer has been applied to a reverse side of the wafer while a focused spot of the laser beam is being positioned within the wafer along projected dicing lines thereof, thereby forming modified layers in the wafer along the projected dicing lines. After the modified layers have been formed in the wafer, the method of transferring a wafer is carried out, and the face side of the wafer is exposed upwardly. Thereafter, external forces are exerted on the wafer to divide the wafer into individual device chips along the modified layers that function as division initiating points, and then a pick-up step is carried out to pick up the device chips.

Figure 1:
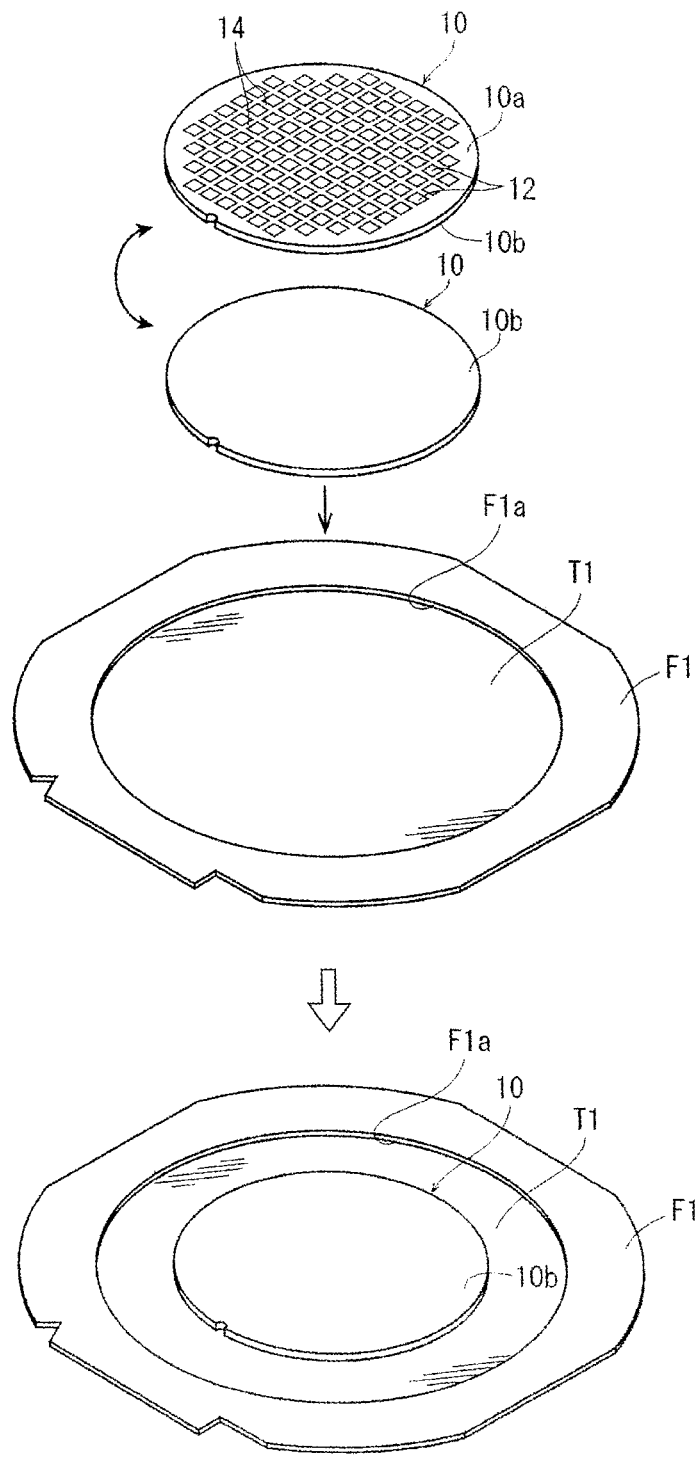
FIG. 1 is a perspective view illustrating the manner in which a wafer as a workpiece according to an embodiment of the present invention, a first frame, and a first tape are combined together.

FIG. 1 illustrates in perspective a semiconductor wafer 10 as a workpiece to be transferred in the method of transferring a wafer. The wafer 10 has a face side 10a as one surface where a plurality of areas are demarcated by a plurality of intersecting projected dicing lines 14 and a plurality of devices 12 are formed in the respective areas.

As illustrated in an upper section of FIG. 1, an annular first frame F1 having an opening F1a in which the wafer 10 can be positioned and a first tape T1 having a sticky layer on its face side are prepared for use in combination with the wafer 10. The wafer 10 is positioned centrally in the opening F1a with the face side 10a facing downwardly and a reverse side 10b thereof as another surface facing upwardly. The wafer 10 and the first frame F1 are pressure-bonded to the first tape T1, so that the wafer 10 is held on the first frame F1 by the tape T1 as illustrated in a lower section of FIG. 1.

Figure 2A:
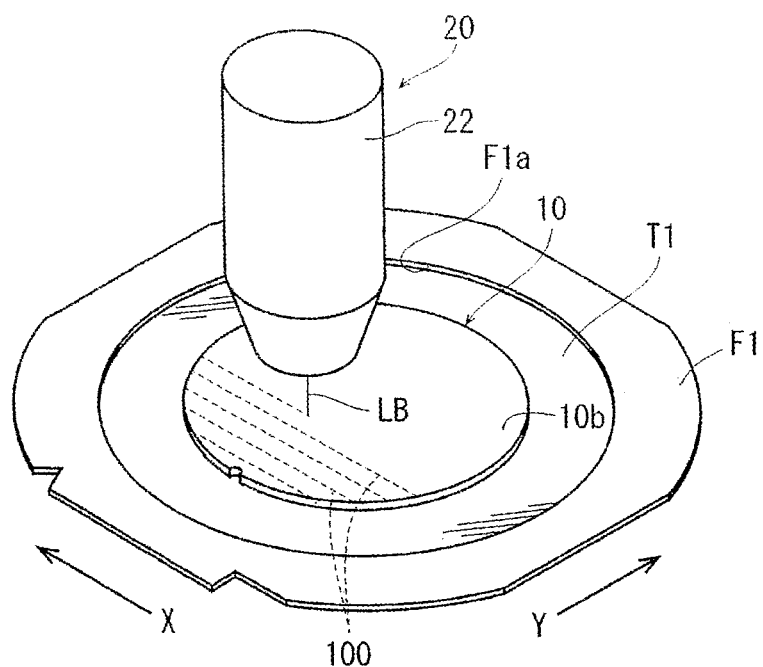
FIG. 2A is a perspective view illustrating the manner in which a laser processing process for forming modified layers in the wafer along projected dicing lines thereon is carried out.

The wafer 10 held on the first frame F1 by the tape T1 is then delivered to a laser processing apparatus 20 illustrated in FIG. 2A. Only part of the laser processing apparatus 20 is illustrated in FIG. 2A. The laser processing apparatus 20 includes a chuck table, not illustrated, for holding the wafer 10 under suction thereon and a laser beam applying unit having a beam condenser 22 that applies a laser beam LB having a wavelength transmittable through the wafer 10 to the wafer 10 held on the chuck table. The laser processing apparatus 20 also includes an X-axis feeding mechanism, not illustrated, for processing-feeding the chuck table and the beam condenser 22 relatively to each other in X-axis directions, a Y-axis feeding mechanism, not illustrated, for indexing-feeding the chuck table and the beam condenser 22 relatively to each other in Y-axis directions perpendicular to the X-axis directions, and a rotating mechanism, not illustrated, for rotating the chuck table about its vertical central axis.

The wafer 10 that has been delivered to the laser processing apparatus 20 is placed and held under suction on the chuck table of the laser processing apparatus 20 with the reverse side 10b facing upwardly. An alignment step is then performed on the wafer 10 held on the chuck table, by alignment means, not illustrated, that includes an infrared image capturing device capable of applying infrared rays to the wafer 10 and capturing an image of reflected rays from the infrared rays transmitted from the reverse side 10b of the wafer 10. In the alignment step, the position of one of the projected dicing lines 14 on the face side 10a of the wafer 10 is detected, and the chuck table is rotated by the rotating mechanism to align the detected projected dicing line 14 with the X-axis directions on the basis of the captured image. Information regarding the detected position of the projected dicing line 14 is stored in control means, not illustrated, of the laser processing apparatus 20.

Figure 2B:
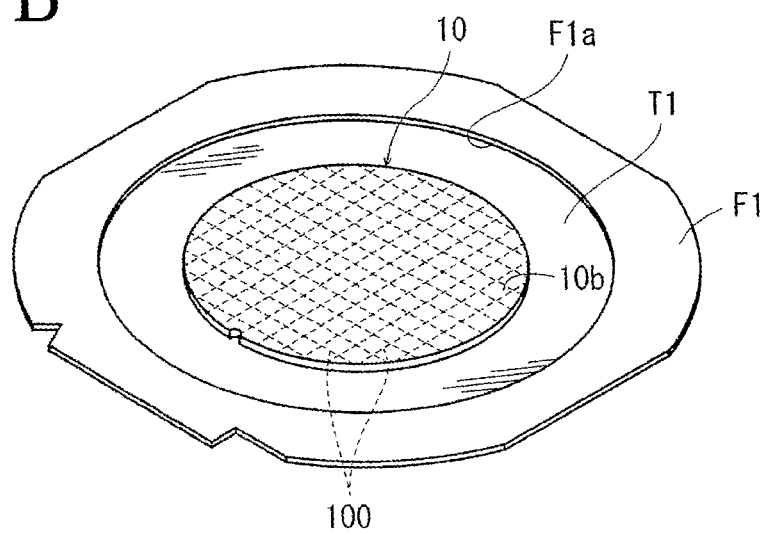
FIG. 2B is a perspective view illustrating the modified layers formed in the wafer.

On the basis of the information regarding the detected position of the projected dicing line 14 obtained in the alignment step, the beam condenser 22 of the laser beam applying unit is positioned at a processing start position on the projected dicing line 14 that extends in a first direction. The beam condenser 22 emits and applies the laser beam LB to the wafer 10 while positioning the focused spot of the laser beam LB within the wafer 10 along the projected dicing line 14, and the X-axis feeding mechanism processing-feeds the chuck table and hence the wafer 10 thereon in one of the X-axis directions, thereby forming a modified layer 100 in the wafer 10 along the projected dicing line 14 extending in the first direction. After the modified layer 100 has been formed in the wafer 10 along the projected dicing line 14, the Y-axis feeding mechanism indexing-feeds the chuck table and hence the wafer 10 thereon in one of the Y-axis directions by a distance commensurate with the interval between adjacent projected dicing lines 14 to position a next projected dicing line 14 extending in the first direction directly below the beam condenser 22. Then, the beam condenser 22 emits and applies the laser beam LB to the wafer 10 while positioning the focused spot of the laser beam LB within the wafer 10 along the next projected dicing line 14, and the X-axis feeding mechanism processing-feeds the chuck table and hence the wafer 10 thereon in one of the X-axis directions, thereby forming a modified layer 100 in the wafer 10 along the next projected dicing line 14 extending in the first direction. The above process is repeated to form modified layers 100 in the wafer 10 along all the projected dicing lines 14 that extend in the first direction. The modified layers 100 are formed in the wafer 10 along the projected dicing lines 14 and cannot actually be seen from outside of the wafer 10. In FIGS. 2A, 2B and some other figures, the modified layers 100 are indicated by the broken lines for illustrative purposes.

Then, the rotating mechanism rotates the chuck table and hence the wafer 10 thereon through 90 degrees to align one of the projected dicing lines 14 that extend in a second direction perpendicular to the first direction with the X-axis directions. The beam condenser 22 emits and applies the laser beam LB to the wafer 10 while positioning the focused spot of the laser beam LB within the wafer 10 along the projected dicing line 14 extending in the second direction, and the X-axis feeding mechanism processing-feeds the chuck table and hence the wafer 10 thereon in one of the X-axis directions, thereby forming a modified layer 100 in the wafer 10 along the projected dicing line 14 extending in the second direction. The wafer 10 is then indexing-fed to position a next projected dicing line 14 extending in the second direction directly below the beam condenser 22. Then, the beam condenser 22 emits and applies the laser beam LB to the wafer 10 while positioning the focused spot of the laser beam LB within the wafer 10 along the next projected dicing line 14, and the X-axis feeding mechanism processing-feeds the chuck table and hence the wafer 10 thereon in one of the X-axis directions, thereby forming a modified layer 100 in the wafer 10 along the next projected dicing line 14 extending in the second direction. The above process is repeated to form modified layers 100 in the wafer 10 along all the projected dicing lines 14 that extend in the second direction, as illustrated in FIG. 2B. In this manner, the modified layers 100 are formed in the wafer 10 along all the projected dicing lines 14 on the face side 10a of the wafer 10. After the laser processing apparatus 20 has processed the wafer 10 with the laser beam LB, the method of transferring a wafer according to the present embodiment is carried out in order to make the wafer 10 ready for the pick-up step following the division of the wafer 10 into individual device chips.

Figure 3:
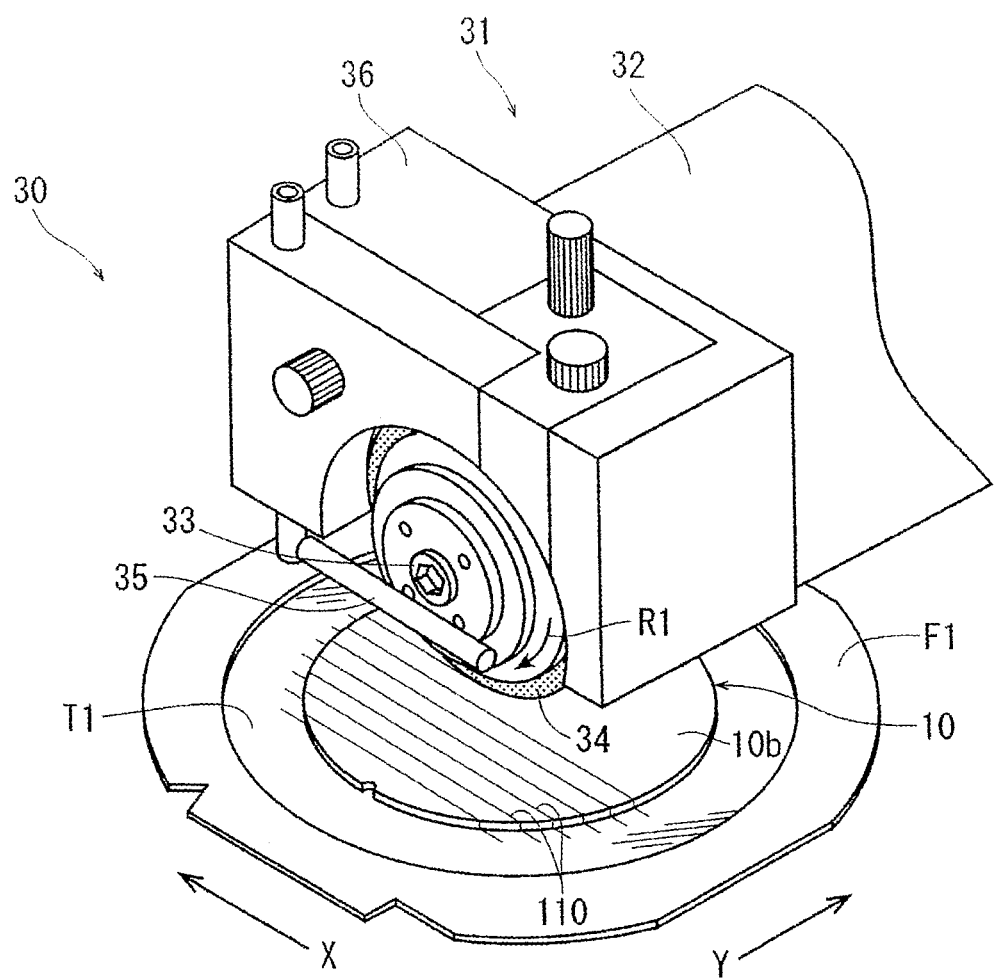
FIG. 3 is a perspective view illustrating the manner in which a cutting process is carried out.

The process that is to be applied to the wafer 10 for making the wafer 10 suitable for method of transferring a wafer according to the present invention is not limited to the laser processing process described above, and may be a cutting process that can be performed by a dicing apparatus 30 illustrated in FIG. 3, for example. The cutting process will be described below with reference to FIG. 3.

The wafer 10 held on the first frame F1 by the tape T1 as described above with reference to FIG. 1 is delivered to the dicing apparatus 30 illustrated in FIG. 3. Only part of the dicing apparatus 30 is illustrated in FIG. 3.

The dicing apparatus 30 includes a chuck table, not illustrated, for holding the wafer 10 under suction and a cutting unit 31 for cutting the wafer 10 held under suction on the chuck table. The chuck table is rotatable about its central axis by a rotating mechanism. The dicing apparatus 30 also includes an X-axis moving mechanism, not illustrated, for processing-feeding the chuck table in X-axis directions indicated by an arrow X. The cutting unit 31 includes a spindle 33 rotatably supported in a spindle housing 32 axially extending in Y-axis directions indicated by an arrow Y, an annular cutting blade 34 mounted on a distal end of the spindle 33, a cutting fluid nozzle 35 for supplying a cutting fluid to a region where the wafer 10 is cut by the cutting blade 34, and a blade cover 36 covering the cutting blade 34. The dicing apparatus 30 also includes a Y-axis moving mechanism, not illustrated, for indexing-feeding the cutting blade 34 in the Y-axis directions. The cutting blade 34 on the distal end of the spindle 33 is rotatable about its central axis by a spindle motor, not illustrated, in the direction indicated by an arrow R1.

Prior to a dividing step of dividing the wafer 10 into individual device chips with the cutting blade 34, the wafer 10 is placed and held under suction on the chuck table of the dicing apparatus 30 with the reverse side 10b facing upwardly. An alignment step, which is similar to the alignment step described above, is then performed on the wafer 10, aligning one of the projected dicing lines 14 extending in a first direction with the X-axis directions and the cutting blade 34. Then, the cutting blade 34 that is being rotated at a high speed is forced to cut into the wafer 10 from the reverse side 10b along the projected dicing line 14 aligned with the X-axis directions, and the chuck table is processing-fed by the X-axis moving mechanism to form a dividing groove 110 in the wafer 10 along the projected dicing line 14. Then, the chuck table is indexing-fed by the Y-axis moving mechanism to align a next projected dicing line 14 extending in the first direction with the X-axis directions and the cutting blade 34. Then, the cutting blade 34 forms a dividing groove 110 in the wafer 10 along the next projected dicing line 14 in the same manner as described above. The above process is repeated to form dividing grooves 110 in the wafer 10 along all the projected dicing lines 14 that extend in the first direction.

Then, the rotating mechanism rotates the chuck table and hence the wafer 10 thereon through 90 degrees to align one of the projected dicing lines 14 that extend in a second direction perpendicular to the first direction with the X-axis directions and the cutting blade 34. The cutting process described above is performed on the wafer 10 along all the projected dicing lines 14 extending in the second direction, thereby forming dividing grooves 110 in the wafer 10 along all the projected dicing lines 14 extending in the second direction. After the dicing apparatus 30 has formed the dividing grooves 110 in the wafer 10 with the cutting blade 34, dividing the wafer 10 into individual device chips including the respective devices 12, the method of transferring a wafer according to the present embodiment is carried out. The method of transferring a wafer according to the present embodiment will be described below. According to the present embodiment, it is assumed that the laser processing apparatus 20 has processed the wafer 10 with the laser beam LB before the method of transferring a wafer is carried out.

Figure 4A:
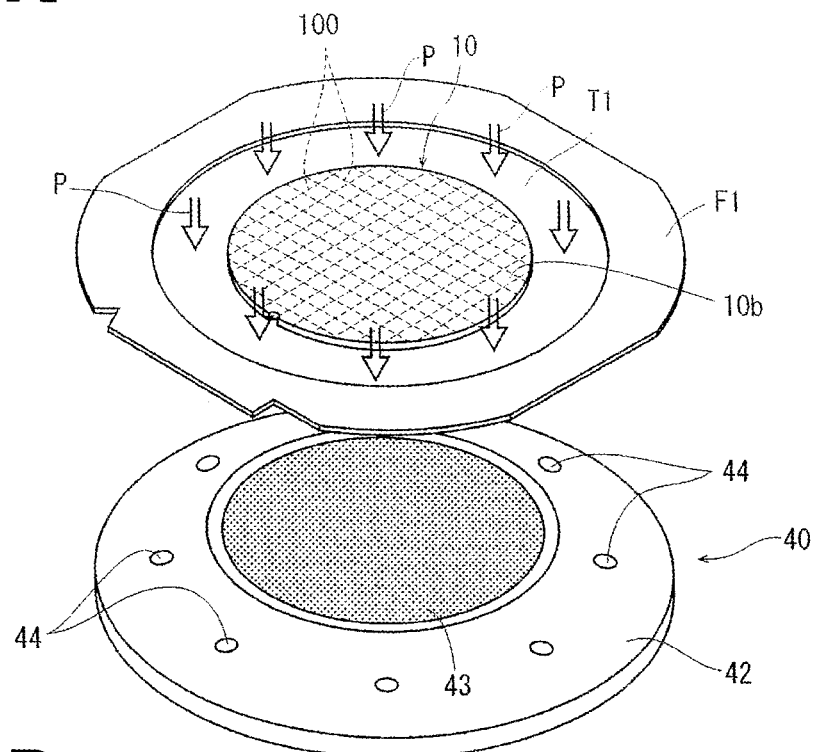
FIG. 4A is a perspective view illustrating the manner in which a first-frame removing step is carried out.
Figure 4B:
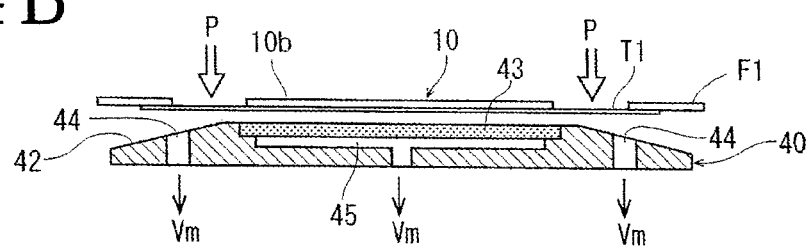
FIG. 4B is a cross-sectional view of the assembly illustrated in FIG. 4A.

The wafer 10 processed by the laser beam LB is delivered to a table 40 for removing a frame illustrated in FIG. 4A, and positioned above the table 40. The table 40 is a substantially circular table having an annular tapered surface 42 as an upper surface and a circular flat suction chuck 43 that is disposed centrally on the annular tapered surface 42 and that is similar in dimension to the wafer 10. The suction chuck 43 is made of an air-permeable porous material and fluidly connected to suction means, not illustrated. As illustrated in FIG. 4B, the annular tapered surface 42 includes a slanted surface that is progressively lower toward an outer circumferential edge thereof. The table 40 has a plurality of suction holes 44 defined therethrough that are open in the annular tapered surface 42 at spaced intervals along a circular array surrounding the suction chuck 43. The suction holes 44 are also fluidly connected to the suction means. When the suction means is actuated, it generates a negative pressure Vm that is transmitted to the suction chuck 43 and hence an upper surface thereof and also to the suction holes 44.

Figure 4C:
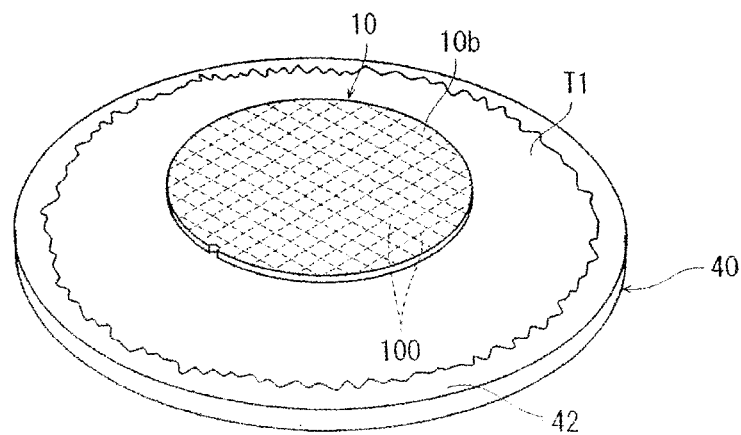
FIG. 4C is a perspective view of the first tape and the wafer that have undergone the first-frame removing step.

After the wafer 10 held on the first frame F1 by the first tape T1 has been positioned above the table 40, the suction means is actuated, and the first frame F1 is fixed in position by fixing means, not illustrated. Then, as illustrated in FIG. 4B, pressing forces P for pressing the first tape T1 downwardly are applied to an annular region of the first tape T1 that lies between the first frame F1 and the wafer 10, detaching the first tape T1 downwardly from the first frame F1 (first-frame removing step). As illustrated in FIG. 4C, the wafer 10 is drawn under the negative pressure Vm to the suction chuck 43, and an outer circumferential region of the first tape T1 is drawn under the negative pressure Vm to the annular tapered surface 42 of the table 40.

Figure 5A:
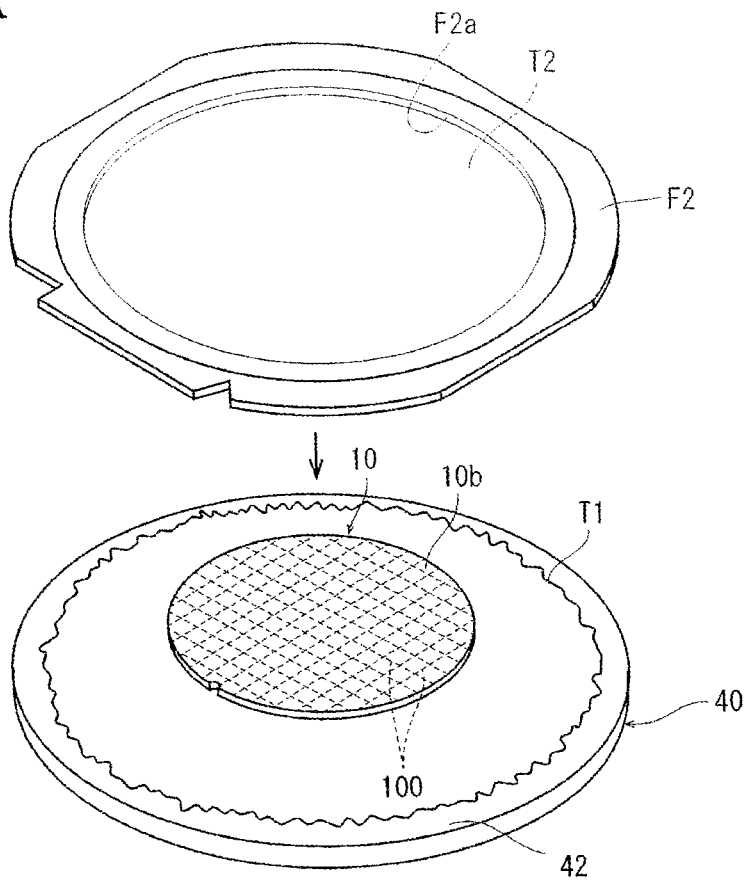
FIG. 5A is a perspective view illustrating the manner in which a second tape pressure-bonded to a second frame is positioned on the wafer.

After the first-frame removing step has been carried out, as illustrated in FIG. 5A, a second frame F2 with a circular second tape T2 pressure-bonded thereto is prepared. The second frame F2 has an opening F2a in which the wafer 10 can be positioned. The second frame F2 with the circular second tape T2 pressure-bonded thereto has a reverse side facing upwardly. According to the present embodiment, the second frame F2 and the first frame F1 are made of the same structure and material, whereas the second tape T2 and the first tape T1 are made of the same structure and material.

Figure 5B:
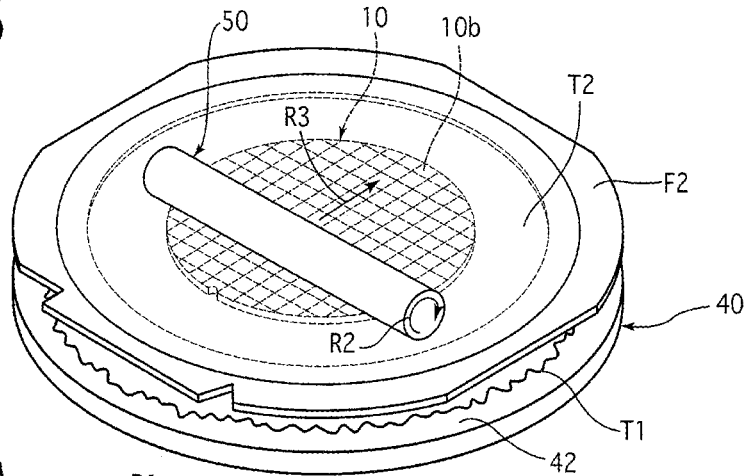
FIG. 5B is a perspective view illustrating the manner in which a second-tape pressure-bonding step for pressure-bonding the second tape illustrated in FIG. 5A to the wafer is carried out.
Figure 5C:
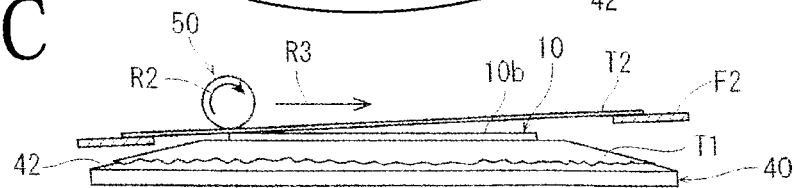
FIG. 5C is a side elevational view, partly in cross section, illustrating the manner in which the second-tape pressure-bonding step is carried out.

Then, the second tape T2 that is pressure-bonded to the second frame F2 and has the sticky layer facing downwardly is pressure-bonded to the upwardly facing reverse side 10b of the wafer 10 held under suction on the table 40. The second tape T2 is pressure-bonded to the reverse side 10b of the wafer 10 with use of a pressure-bonding roller 50 illustrated in FIG. 5B, for example. Specifically, the pressure-bonding roller 50 is rotated about its central axis in the direction indicated by an arrow R2 while pressing the second tape T2 against the wafer 10 and moved in the direction indicated by an arrow R3, thereby progressively pressure-bonding the second tape T2 to the reverse side 10b of the wafer 10 (second-tape pressure-bonding step). FIG. 5C illustrates in side elevation the manner in which the second-tape pressure-bonding step is carried out, with only the second tape T2 and the second frame F2 being illustrated in cross section. As illustrated in FIG. 5C, the second tape T2 is inclined to the reverse side 10b of the wafer 10, and the pressure-bonding roller 50 is pressed downwardly against the second tape T2 while being rotated in the direction indicated by the arrow R2 and moved in the direction indicated by the arrow R3, progressively pressure-bonding the second tape T2 to the reverse side 10b of the wafer 10 in a manner to progressively flatten the slanted second tape T2 against the wafer 10. Therefore, air is prevented from being trapped between the second tape T2 and the reverse side 10b of the wafer 10. According to the present embodiment, since the table 40 has the annular tapered surface 42 as its upper surface as described above, the outer circumferential region of the first tape T1 is not pressure-bonded to the second tape T2.

Figure 6:
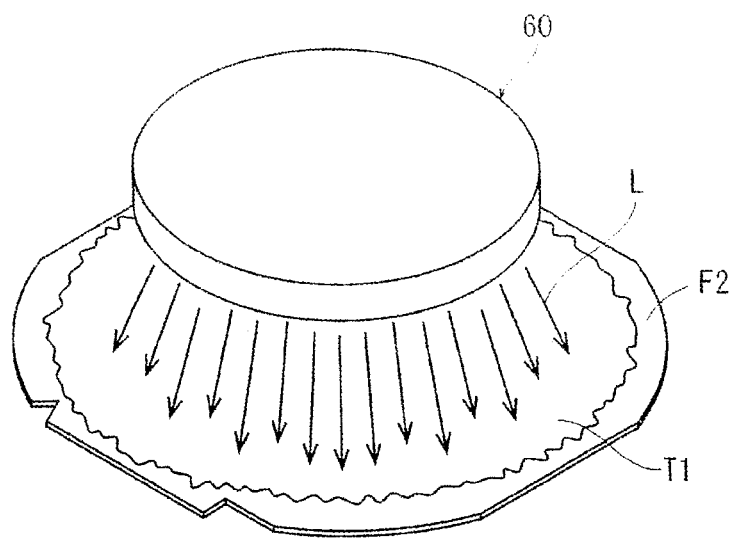
FIG. 6 is a perspective view illustrating the manner in which a pressure-bonding force reducing step is carried out.

After the second-tape pressure-bonding step has been carried out, the suction means fluidly connected to the table 40 is inactivated, releasing the first tape T1 from the table 40. As illustrated in FIG. 6, a pressure-bonding force reducing step is carried out to reduce the pressure-bonding force of the first tape T1 by imparting an external stimulus to the first tape T1. In the pressure-bonding force reducing step, specifically, ultraviolet ray applying means 60 is positioned above the first tape T1 and applies ultraviolet rays L to the first tape T1. The first tape T1 is an ultraviolet-curable tape that can be cured upon exposure to ultraviolet rays L. The ultraviolet rays L are applied as an external stimulus to the first tape T1, reducing the pressure-bonding force of the first tape T1 by curing the sticky layer thereof (pressure-bonding force reducing step). In FIG. 6, the ultraviolet ray applying means 60 is illustrated as being positioned above the first tape T1 to apply ultraviolet rays L from above to the first tape T1. Actually, however, after the second-tape pressure-bonding step has been carried out as illustrated in FIGS. 5A through 5C, the first tape T1 is turned over to face downwardly and the ultraviolet ray applying means 60 applies ultraviolet rays L from below to the first tape T1. The first tape T1 is thus prevented from being bonded to the second tape T2. However, the present invention is not limited to the actual process in which the first tape T1 faces downwardly and the ultraviolet ray applying means 60 applies ultraviolet rays L from below to the first tape T1. According to the present invention, the first tape T1 may face upwardly and the ultraviolet ray applying means 60 may apply ultraviolet rays L from above to the first tape T1.

Figure 7:
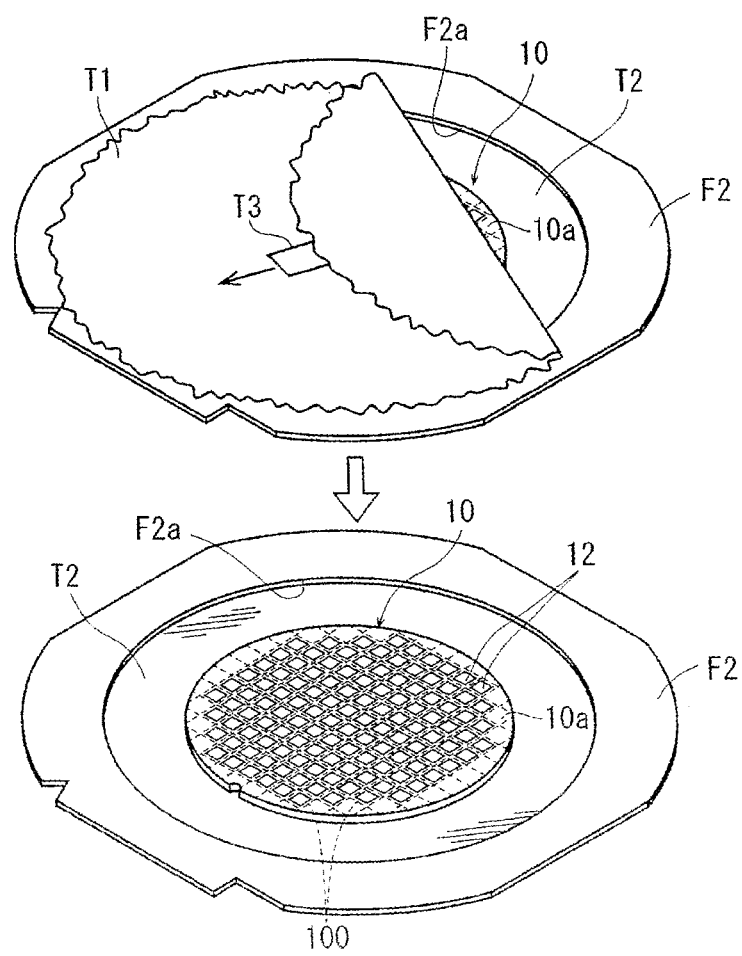
FIG. 7 is a perspective view illustrating the manner in which a peeling step is carried out.

After the pressure-bonding force reducing step has been carried out, as illustrated in an upper section of FIG. 7, the first tape T1 whose pressure-bonding force has been reduced is peeled off from the face side 10a of the wafer 10 that is pressure-bonded to the second tape T2 (peeling step). For carrying out the peeling step, a peeling tape T3 is affixed to an outer circumferential portion of the first tape T1 as illustrated in the upper section of FIG. 7, and then pulled horizontally to peel off the first tape T1 from the face side 10a of the wafer 10 as illustrated in a lower section of FIG. 7. The wafer 10 is thus transferred from the first tape T1 to the second tape T2 without the wafer 10 being damaged. The wafer 10 as transferred to the second tape T2 has the face side 10a facing upwardly in readiness for the pick-up step. The method of transferring a wafer according to the present embodiment now comes to an end.

After the wafer 10 has been transferred from the first tape T1 to the second tape T2 with the face side 10a being exposed, external forces are exerted on the wafer 10 to divide the face side 10a along the modified layers 100 that function as division initiating points into individual device chips. Then, the pick-up step is carried out to pick up the individual device chips.

According to the above embodiment, the pressure-bonding force reducing step is carried out after the first-frame removing step and the second-tape pressure-bonding step have been carried out. However, the present invention is not limited to such a sequence of steps. The pressure-bonding force reducing step may be carried out after the first-frame removing step has been carried out.

Further, according to the above embodiment, ultraviolet rays are imparted as an external stimulus to the first tape T1 in the pressure-bonding force reducing step. However, the present invention is not limited to ultraviolet rays as an external stimulus. Another form of external stimulus such as heating or cooling may be imparted to the first tape T1 to reduce the pressure-bonding force thereof. An external stimulus to be applied to the first tape T1 is selected depending on the material of the first tape T1.

Moreover, according to the above embodiment, the first tape T1 has a sticky layer on its face side and the second tape T2 also has a sticky layer on its face side. However, the present invention is not limited to such a tape structure. The first tape T1 and the second tape T2 may each include a thermocompression bonding tape free of a sticky layer, which is made of polyolefin or polyester that develops sticky power when heated.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of transferring a wafer from a first tape that has been pressure-bonded to one surface of the wafer and also to a first frame having an opening with the wafer positioned therein, to a second tape that has been pressure-bonded to a second frame, comprising:
   a first-frame removing step of detaching the first tape from the first frame by pressing a portion of the first tape that lies between the first frame and the wafer;
   a second-frame pressure-bonding step of pressure-bonding the second tape pressure-bonded to the second frame to another surface of the wafer;
   a pressure-bonding force reducing step of reducing a pressure-bonding force of the first tape by imparting an external stimulus to the first tape; and
   a peeling step of peeling off the first tape from the one surface of the wafer pressure-bonded to the second tape.

2. The method according to claim 1, wherein the pressure-bonding force reducing step is carried out before the first-frame removing step.

3. The method according to claim 1, wherein the first tape is an ultraviolet-curable tape that is cured upon exposure to ultraviolet rays, and the pressure-bonding force reducing step includes the step of applying ultraviolet rays to the first tape to reduce the pressure-bonding force thereof.

4. The method according to claim 1, wherein the first-frame removing step is performed before the second-frame pressure-bonding step.

5. The method according to claim 1, wherein using a substantially circular table having an annular tapered surface during the first-frame removing step.

6. The method according to claim 5, wherein the annular tapered surface includes a slanted surface that is progressively lower toward an outer circumferential edge thereof.

7. The method according to claim 5, wherein the substantially circular table has a circular flat suction chuck that is disposed centrally on the annular tapered surface.

8. The method according to claim 7, wherein suction chuck is similar in dimension to the wafer.

9. The method according to claim 7, wherein the annular tapered surface includes a slanted surface that is progressively lower toward an outer circumferential edge thereof.

10. The method according to claim 9, wherein the table has a plurality of suction holes defined therethrough that are open in the annular tapered surface at spaced intervals along a circular array surrounding the suction chuck.

11. The method according to claim 10, wherein during the first-frame removing step, the wafer held on the first frame by the first tape is been positioned above the table, and actuating suction via the suction holes and the suction chuck to hold the wafer via the first tape to the suction chuck.

12. The method according to claim 11, wherein after the wafer is held to the suction chuck, applying pressing forces to an annular region of the first tape that lies between the first frame and the wafer for pressing the first tape downwardly so that the first tape detaches from the first frame and the first tape is held by the suction chuck and the suction holes.

13. The method according to claim 12, wherein the first-frame removing step is performed before the second-frame pressure-bonding step.

14. The method according to claim 13, wherein the second-frame pressure-bonding step is performed while the wafer is held under suction on the table.

15. The method according to claim 14, wherein a pressure-bonding roller is used to pressure-bond the second tape to the wafer.

16. The method according to claim 15, wherein the second tape is inclined to a reverse side of the wafer, and the pressure-bonding roller is pressed downwardly against the second tape while being rotated and moved across the wafer to progressively pressure-bond the second tape to the reverse side of the wafer in a manner to progressively flatten the slanted second tape against the wafer.

17. The method according to claim 16, wherein the second tape is pressure-bonded to the wafer without the second tape being pressure-bonded to the first tape held against the table.

18. The method according to claim 17, wherein after the pressure-bonding force reducing step has been carried out, affixing a peeling tape is to an outer circumferential portion of the first tape and then pulling the peeling tape to peel off the first tape from the one surface of the wafer.

19. The method according to claim 18, further comprising after the peeling step, dividing the wafer into individual devices chips along projected dicing lines.

\* \* \* \* \*